[19] US008929432B2

(12) United States Patent
Fay

(10) Patent No.: US 8,929,432 B2
(45) Date of Patent: Jan. 6, 2015

(54) COMBINATION A/53 AND A/153 RECEIVER USING A HIHO VITERBI DECODER

(75) Inventor: Luke Fay, San Diego, CA (US)

(73) Assignee: Sony Corporation, Tokyo (JP)

( * ) Notice: Subject to any disclaimer, the term of this patent is extended or adjusted under 35 U.S.C. 154(b) by 305 days.

(21) Appl. No.: 13/607,097

(22) Filed: Sep. 7, 2012

(65) Prior Publication Data

US 2014/0072056 A1 Mar. 13, 2014

(51) Int. Cl.
*H04N 7/26* (2006.01)
*H03M 13/00* (2006.01)

(52) U.S. Cl.
USPC .......................................... 375/240; 714/756

(58) Field of Classification Search
CPC . H04N 7/50; H04N 7/26335; H04N 7/26707; H04N 7/26946; H04N 7/26244
USPC ..................................................... 375/240.25
See application file for complete search history.

(56) References Cited

U.S. PATENT DOCUMENTS

| | | | |
|---|---|---|---|
| 5,825,832 A | 10/1998 | Benedetto | |
| 5,841,819 A | 11/1998 | Hu et al. | |
| 7,197,685 B2 * | 3/2007 | Limberg | 714/756 |
| 7,240,274 B2 | 7/2007 | Yellin et al. | |
| 7,440,523 B2 | 10/2008 | Lais et al. | |
| 7,779,327 B2 * | 8/2010 | Lee et al. | 714/755 |
| 7,814,389 B2 * | 10/2010 | Yu et al. | 714/755 |
| 7,904,780 B2 * | 3/2011 | Brandman | 714/752 |
| 8,050,298 B2 * | 11/2011 | Yu et al. | 370/527 |
| 8,126,061 B2 * | 2/2012 | Cooper et al. | 375/240.26 |
| 8,144,258 B2 | 3/2012 | Lee et al. | |
| 8,284,832 B2 * | 10/2012 | Limberg | 375/240 |
| 8,594,139 B2 * | 11/2013 | Yu et al. | 370/528 |
| 2007/0140257 A1 * | 6/2007 | Lee et al. | 370/395.6 |
| 2007/0160333 A1 * | 7/2007 | Schaich et al. | 385/100 |
| 2009/0304114 A1 | 12/2009 | Burg | |
| 2009/0322961 A1 | 12/2009 | Limberg | |
| 2009/0323823 A1 | 12/2009 | Limberg | |
| 2011/0149828 A1 | 6/2011 | Song et al. | |
| 2014/0233633 A1 * | 8/2014 | Hannuksela | 375/240.02 |

FOREIGN PATENT DOCUMENTS

WO 2011034844 A2 3/2011

* cited by examiner

*Primary Examiner* — Sath V Perungavoor
*Assistant Examiner* — Howard D Brown, Jr.
(74) *Attorney, Agent, or Firm* — John P. O'Banion

(57) ABSTRACT

A broadcast and receiver system for performing content from combined A/53 and A/153 standard transmissions enabling simultaneous reception of both signal types with one device. A combination HDTV/Mobile DTV chip can be used that does not alter the legacy HDTV forward error correction (FEC) decoder and Mobile DTV standard transmissions may include extra training signals aiding the demodulation of legacy HDTV reception. Two separate Trellis decoders can be used: one for A/53 legacy HDTV decoding and the other for A/153 Mobile DTV decoding that uses a Hard Input Hard Output (HIHO) type of architecture. Separate Viterbi decoders are allocated for each block of data with a block Viterbi rotator to parse out/collect results of each Viterbi decoder. Each block has its convolutional encoder reset at the beginning. The second Trellis decoder operates serially so as not to disturb the A/53 HDTV data but could also be operated in parallel.

20 Claims, 19 Drawing Sheets

| x | state (E(x)) | LLR Equation | LLR Assignment |
|---|---|---|---|
| 1 | 1 | 0 | 0 |
| 3 | 1 | 2 | 5 |
| 5 | 1 | 4 | 7 |
| 7 | 1 | 6 | 7 |
| 1 | 3 | 6 | 5 |
| 3 | 3 | 0 | 0 |
| 5 | 3 | 6 | 6 |
| 7 | 3 | 12 | 7 |
| 1 | 5 | 20 | 7 |
| 3 | 5 | 10 | 6 |
| 5 | 5 | 0 | 0 |
| 7 | 5 | 10 | 5 |
| 1 | 7 | 42 | 7 |
| 3 | 7 | 28 | 7 |
| 5 | 7 | 14 | 5 |
| 7 | 7 | 0 | 0 |
| | | Usual | New assignment |

Numbers are not following any equation and assigned through simulation trial and error

FIG. 9

| Input | Hamming Distance | | | | |
|---|---|---|---|---|---|
| | 0 | 1 | 2 | 3 | 4 |
| 0000 (0) | 0 | 1,2,4,8 | 3,6,12,9,10,5 | 7,11,13,14 | 15 |
| 0001 (1) | 1 | 0,3,5,9 | 7,13,11,2,4,8 | 6,10,12,15 | 14 |
| 0010 (2) | 2 | 0,3,6,10 | 7,11,14,8,4,1 | 5,9,12,15 | 13 |
| 0011 (3) | 3 | 7,11,2,1 | 15,6,10,5,9,0 | 4,8,13,14 | 12 |
| 0100 (4) | 4 | 0,5,6,12 | 7,14,13,1,2,8 | 3,9,10,15 | 11 |
| 0101 (5) | 5 | 7,13,4,1 | 15,6,12,3,9,0 | 2,8,11,14 | 10 |
| 0110 (6) | 6 | 7,14,4,2 | 15,5,12,3,10,0 | 1,8,11,13 | 9 |
| 0111 (7) | 7 | 15,6,5,3 | 4,1,2,11,13,14 | 0,9,10,12 | 8 |
| 1000 (8) | 8 | 0,9,10,12 | 11,14,13,4,2,1 | 3,5,6,15 | 7 |
| 1001 (9) | 9 | 8,11,13,1 | 15,5,3,10,12,0 | 2,4,7,14 | 6 |
| 1010 (10) | 10 | 11,14,8,2 | 15,9,12,6,3,0 | 1,4,7,13 | 5 |
| 1011 (11) | 11 | 15,10,9,3 | 14,13,7,8,1,2 | 0,5,6,12 | 4 |
| 1100 (12) | 12 | 13,14,8,4 | 15,0,9,10,6,5 | 1,2,7,11 | 3 |
| 1101 (13) | 13 | 15,12,9,5 | 14,11,7,4,1,8 | 0,3,10,6 | 2 |
| 1110 (14) | 14 | 15,12,10,6 | 13,11,7,2,4,8 | 0,3,5,9 | 1 |
| 1111 (15) | 15 | 14,13,11,7 | 12,9,3,6,5,10 | 1,2,4,8 | 0 |

| State | Hamming Distance |
|---|---|
| 0 | 2 |
| 3 | 0 |
| 5 | 2 |
| 6 | 2 |
| 9 | 2 |
| 10 | 2 |
| 12 | 4 |
| 15 | 2 |

FIG. 12B

| State | Hamming Distance |
|---|---|
| 0 | 1 |
| 3 | 1 |
| 5 | 1 |
| 6 | 3 |
| 9 | 1 |
| 10 | 3 |
| 12 | 3 |
| 15 | 3 |

FIG. 13A

| State | Hamming Distance |
|---|---|
| 0 | 8 |
| 3 | 0 |
| 5 | 8 |
| 6 | 8 |
| 9 | 8 |
| 10 | 8 |
| 12 | 16 |
| 15 | 8 |

FIG. 13B

| State | Hamming Distance |
|---|---|
| 0 | 4 |
| 3 | 4 |
| 5 | 4 |
| 6 | 12 |
| 9 | 4 |
| 10 | 12 |
| 12 | 12 |
| 15 | 12 |

Input = 0001
State = 0000

FIG. 14A

Input = 0001
State = 0011

FIG. 14B

Input = 0001
State = 0101

FIG. 14C

Input = 0001
State = 1100

FIG. 14D

Input = 0001
State = 1111

FIG. 14E

| State | Hamming Distance | Assigned Values |
|---|---|---|
| 0 | 8 | 8 |
| 3 | 0 | 0 |
| 5 | 8 | 8 |
| 6 | 8 | 8 |
| 9 | 8 | 8 |
| 10 | 8 | 8 |
| 12 | 16 | 16 |
| 15 | 8 | 8 |

FIG. 15A

| State | Hamming Distance | Assigned Values |
|---|---|---|
| 0 | 4 | 2 |
| 3 | 4 | 3 |
| 5 | 4 | 3 |
| 6 | 12 | 13 |
| 9 | 4 | 2 |
| 10 | 12 | 12 |
| 12 | 12 | 13 |
| 15 | 12 | 14 |

FIG. 15B

| State | Hamming Distance | Assigned Values | Iterated Values |
|---|---|---|---|
| 0 | 8 | 8 | 7 |
| 3 | 0 | 0 | 0 |
| 5 | 8 | 8 | 8 |
| 6 | 8 | 8 | 9 |
| 9 | 8 | 8 | 9 |
| 10 | 8 | 8 | 9 |
| 12 | 16 | 16 | 13 |
| 15 | 8 | 8 | 7 |

FIG. 16A

| State | Hamming Distance | Assigned Values | Iterated Values |
|---|---|---|---|
| 0 | 4 | 2 | 2 |
| 3 | 4 | 3 | 3 |
| 5 | 4 | 3 | 4 |
| 6 | 12 | 13 | 13 |
| 9 | 4 | 2 | 4 |
| 10 | 12 | 12 | 12 |
| 12 | 12 | 13 | 13 |
| 15 | 12 | 14 | 14 |

FIG. 16B

COMBINATION A/53 AND A/153 RECEIVER USING A HIHO VITERBI DECODER

CROSS-REFERENCE TO RELATED APPLICATIONS

Not Applicable

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to HDTV and DTV transmitters, receivers and signal processing and decoding systems, and more particularly to mobile decoding of HDTV and an apparatus and method for processing a combined A/53 and A/153 standard broadcast signal with a single chip or device.

2. Description of Related Art

The fundamental problem to be overcome in wireless communications systems is to accurately receive and reproduce data transmitted through noisy channels. In order to achieve the ultimate goal of exactly reproducing the information sent through a memoryless noisy medium, various transmission and reception schemes have been developed. Some channel coding and de-coding systems try to protect transmissions from errors or other disturbances using redundancies and error correction.

Digital high definition television transmissions over terrestrial, cable, and satellite networks, for example, have been standardized. The Advanced Television Systems Committee, Inc. (ATSC), is an international, non-profit organization that has developed a set of voluntary standards for digital television transmissions among different communications media including digital broadcast television, interactive systems, and broadband multimedia communications.

Currently there are two standards, the A/53 HDTV standard and the A/153 Mobile DTV standard, which apply separately to different receivers. The receivers are designed to be separate; e.g., the public either has a mobile DTV receiver or a fixed HDTV receiver, but not a combined receiver. While A/153 operation fits into A/53 to concurrently supply mobile DTV data and HDTV data to the public from one transmitter source, the A/53 performance is not very good for high-dynamic channels.

The ATSC A/53 standard transmitter is shown in the functional block diagram of FIG. 1. It can be seen that the incoming data is randomized and then processed for forward error correction (FEC) in the form of Reed-Solomon (RS) coding, where 20 RS parity bytes are added to each MPEG-2 packet, one-sixth data field interleaving and two-thirds rate trellis coding.

By design, the A/53 Digital Television Standard uses the 6 MHz bandwidth that has been allocated to analog television channels. Depending on the method of transmission, the transport stream can be modulated in various ways once the digital video and audio signals have been compressed and multiplexed by the transmitter.

An ATSC A/53 standard receiver is shown in the functional block diagram of FIG. 2. The ATSC/8VSB A/53 receiver, receives, demodulates, decodes and analyzes 8VSB (eight-level vestigial sideband) signals. The MPEG 2 transport stream is demultiplexed, decompressed and AV synchronized and formatted for the specific television of the user.

The ATSC M/H (mobile/handheld) standard (A/153) allows delivery of multimedia to mobile DTV-equipped cellphones, tablets, laptops, netbooks, in-car navigation systems and other mobile devices. Like the A/53 system, the ATSC Mobile DTV (A/153) scheme is based on vestigial sideband (VSB) modulation, along with some additional error correction mechanisms, and shares the same RF channel as A/53 by using a portion of the total available 19.4 Mb/s bandwidth.

The functional diagrams of FIG. 3A and FIG. 3B, show an A/153 standard transmitter and FIG. 4 illustrates a corresponding A/153 receiver. Generally, the ATSC-M/H (A/153) standard defines a virtual frame structure that is called an M/H Frame that has a fixed duration of 968 ms. The M/H frame consists of 5 M/H subframes and each M/H subframe has 16 M/H numbered slots called M/H-groups. One virtual M/H frame is based on 20 VSB frames (12,480 transport stream packets) and has an offset of 37 transport stream packets to the VSB frame structure.

Although the A/53 HDTV and the A/153 Mobile DTV transmissions can be made from a single source, the corresponding receivers are separate. Accordingly, there is a need for an apparatus and system that can receive and perform both the A/53 standard and A/153 standard transmissions across many different platforms. The present invention satisfies this need, as well as others, and is generally an improvement in the art.

BRIEF SUMMARY OF THE INVENTION

The present invention provides a media broadcast and receiver system for the performance of content from individual or combined A/53 and A/153 standard transmissions. The combined system bridges the gap between terrestrial HDTV and Mobile or hand held Mobile DTV broadcasting by enabling simultaneous reception of both signal types with one device.

An aspect of the present invention is to provide a combination HDTV/Mobile DTV chip without altering the legacy HDTV forward error correction (FEC) decoder. Transmissions according to the Mobile DTV standard include extra training signals which could aid demodulation of legacy HDTV reception for those high dynamic channels. A challenge encountered with a combination receiver is that Mobile DTV has long acquisition times, thereby making prompt channel change times an issue. Therefore, a shorter latency solution would be preferred to speed up training support for HDTV service in a combination receiver.

To combat this latency, another aspect of the invention is the use of a second Trellis decoder enacting a Hard Input Hard Output (HIHO) type of architecture. This enables keeping the existing A/53 FEC structure while only adding a post-processor for A/153 FEC operation. A benefit of this architecture is that both A/53 HDTV data and A/153 Mobile DTV data can be rendered with a single chip.

More particularly, channel change time for A/153 Mobile DTV can be quite long due to Serial Concatenated Convolutional Code (SCCC) iteration time. For some decoders, there could be eight to twelve iterations before data is available. Others have attempted to address latency issues with lower iteration counts, or by displaying graphics during channel change time. However, lower data latency can be achieved by using Trellis decoders in both the A/53 FEC and A/153 FEC decoders according to an aspect of the present invention. Performance may suffer somewhat with this approach, but faster channel change times will result while outputting both sets of data. For a combination A/53 and A/153 demodulator with large signal power, the minor bit error rate (BER) performance decrease will not be noticeable.

One issue with using a second Trellis decoder is that the Log Likelihood Ratios (LLR) need to be calculated with Hard-Decision symbols already decided from the previous A/53 Trellis decoder. To solve this problem, an aspect of the invention is to use assigned LLR numbers which can achieve decent performance instead of calculating those numbers from a typical LLR equation. These assigned LLR numbers do not follow any equation and actually look random.

Part of the data structure in the A/153 Part 2 standard has Serial Concatenated Convolutional Codes (SCCC) parsed out into blocks. Each block can have a separate code rate as well as other Forward Error Correction (FEC) parameter settings. The key point is that each block is RESET at the beginning in the transmitter. This resetting means a Viterbi Decoder memory has to be reset as well during the decoding to have correct operation. This resetting is an issue for Hard Input Hard Output (HIHO) Viterbi decoding because the memory for the Viterbi will be reset with desired values still not shifted out in time within the length of the Viterbi decoding window.

Target applications for A/153 operation (mobile/portable products) involve a SCCC decoder which iterates these separate blocks of data across two Viterbi decoders, and the resetting is not an issue as each block of data is kept in separate memories. However, in a combination A/53 (HDTV) and A/153 (Mobile DTV) receiver using HIHO according to the present invention, an aspect of the invention is for one Viterbi decoder to shift out the last values from the last block while resetting itself for the next block.

According to another aspect of the invention, a broadcast performance system is provided where an In-home second screen device can be fed with the Mobile DTV data content with a combined transmission using the A/53, A/153 combination chip.

A further aspect of the invention is to provide a chip for semiconductor demodulators/receivers of signals with Trellis Decoders. Since convolutional codes require the symbol memory to be stored, the invention allows that memory to be altered (reset) without affecting a seamless output stream of data.

An aspect of the invention is to provide a decoder rotator for use with coding schemes where a coder or code rates are deliberately switched. For example, the rotator may be beneficial to convolutional coding where symbol memory is required with resetting boundaries.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

FIG. 9 is a graph of example numbers used instead of LLR/Euclidean/Hamming distance calculations for a rate ½ Viterbi Decoder.

FIG. 11 is an example of Hamming distance values using the A/153 Part 2: (2009) ¼ rate SCCC code. The highlighted values in dashed lines are valid states in A/153 ¼ rate SCCC coding.

FIG. 12A is chart of Hamming distance for an input value of 3.

FIG. 12B is chart of Hamming distance for an input value of 1.

FIG. 13A is a chart of spaced out Hamming distances for an input value of 3.

FIG. 13B is a chart of spaced out Hamming distances for an input value of 1.

FIG. 14A through FIG. 14E illustrate increase or decrease adjustments of values based on adjacent bit similarity.

FIG. 15A illustrates assigned values when the input value is 3.

FIG. 15B illustrates assigned values when the input value is 1.

FIG. 16A illustrates iterated LLR values based on BER performance when the input value is 3.

FIG. 16B illustrates iterated LLR values based on BER performance when the input value is 1.

DETAILED DESCRIPTION OF THE INVENTION

By way of example, and not of limitation, a preferred embodiment of a combination decoder system according to the present invention is illustrated with reference to FIG. 1 through FIG. 16B.

It will be appreciated that the apparatus embodiments may vary as to configuration and as to the details of the parts, and that the methods may vary as to the specific steps and sequence, without departing from the basic concepts as disclosed herein. The method steps are merely exemplary of the order that these steps may occur. The steps may occur in any order that is desired, such that it still performs the goals of the claimed invention.

Turning now to FIG. 5A, FIG. 5B, FIG. 5C and FIG. 5D, the overall system architecture 10 with a transmitter 12, channel 14, and receiver 16 is schematically shown. The primary objective for the combined A/53 and A/153 M/H platform is to deliver a set of audio and/or video services from a transmission site for receipt by stationary or mobile portable devices. It can be seen that the transmission system generally receives two streams of data input, the M/H service data and the main service data, that is then combined into one stream of MPEG transport stream packets and modulated into the normal 8-VSB signal. The system also includes two separate Trellis decoders, one for A/53 legacy HDTV decoding and the other for A/153 Mobile DTV decoding.

Figure 1:
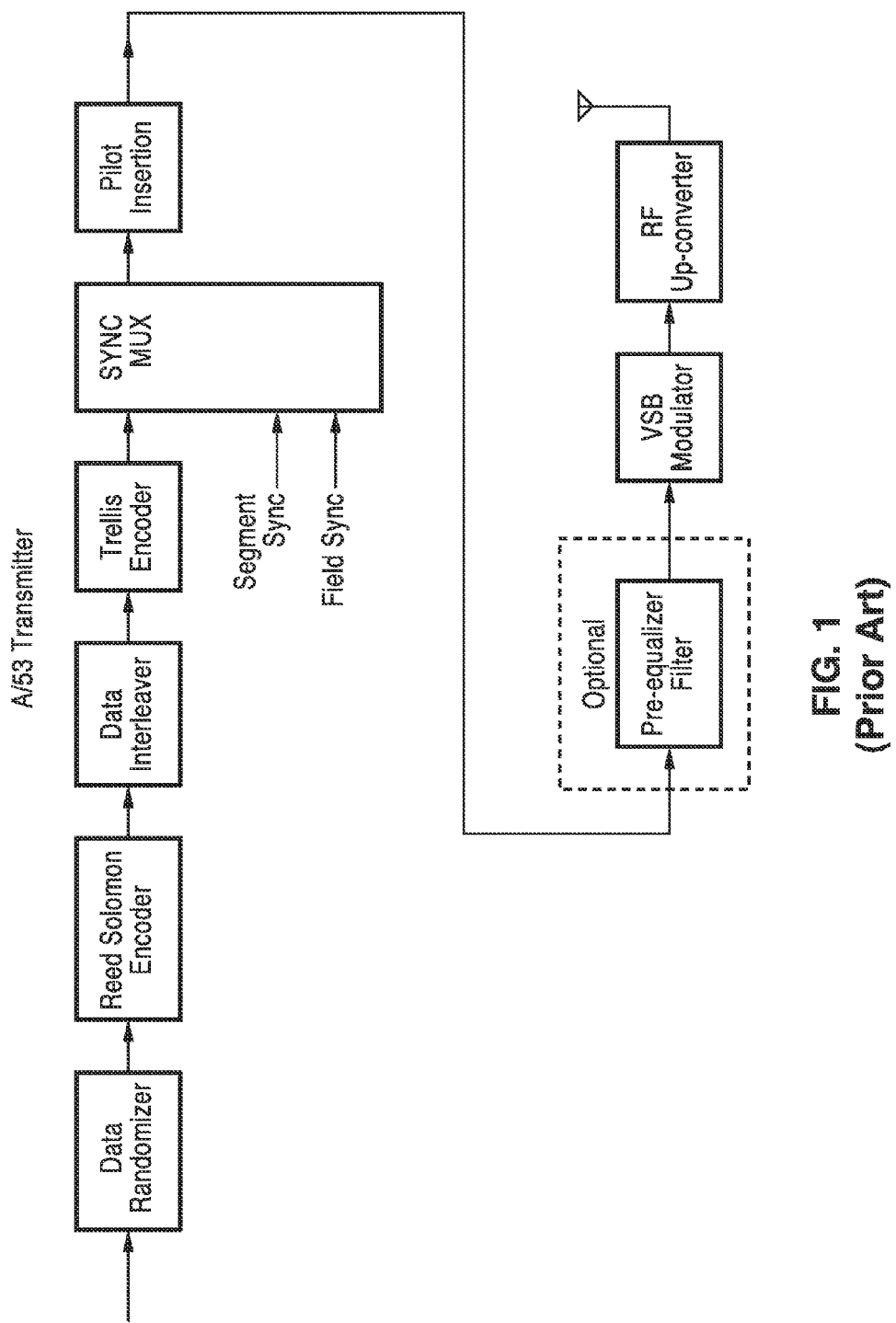
FIG. 1 is a functional block diagram for an A/53 standard transmitter known in the art.
Figure 2:
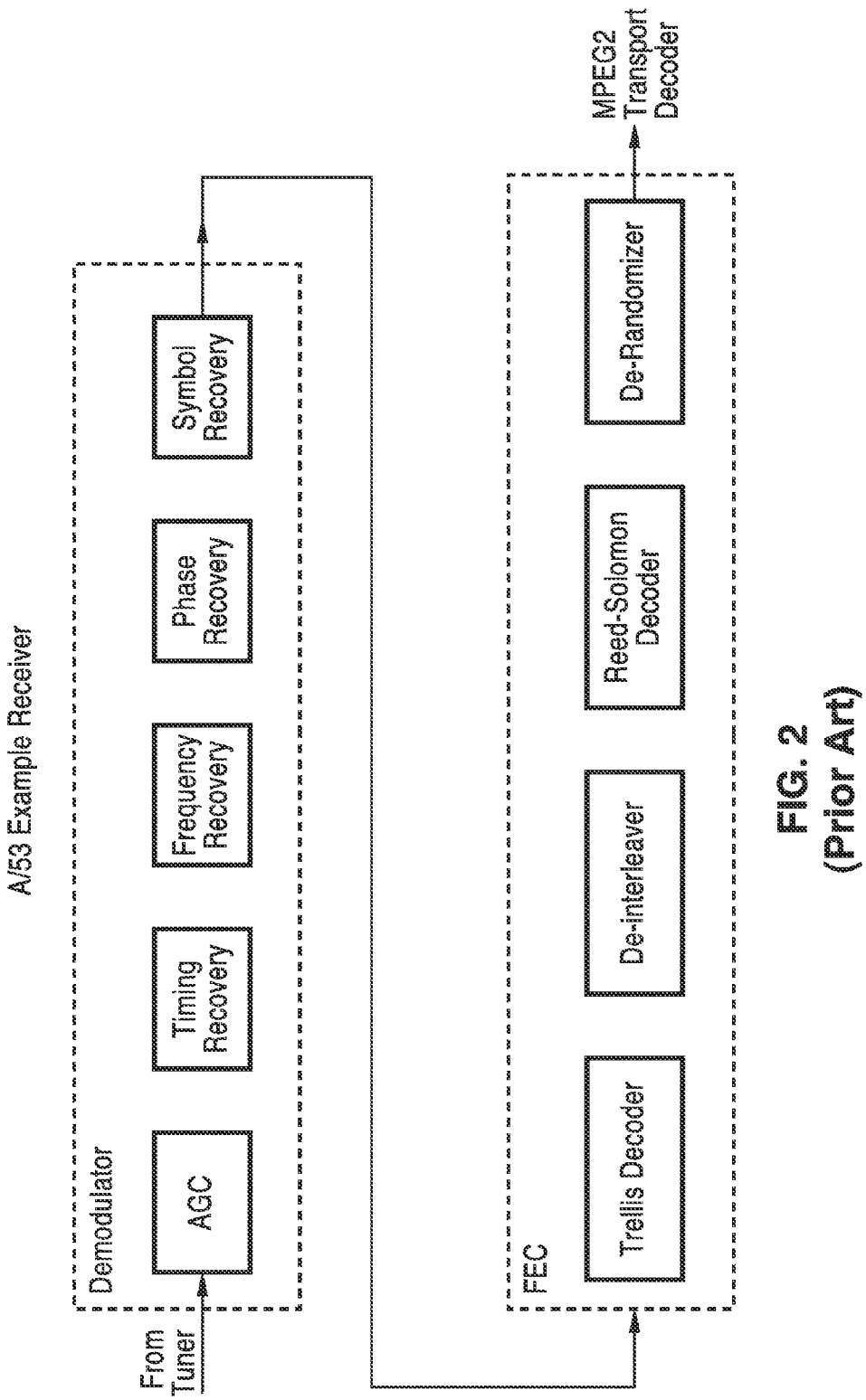
FIG. 2 is a functional block diagram for an A/53 standard receiver known in the art.
Figure 3A:
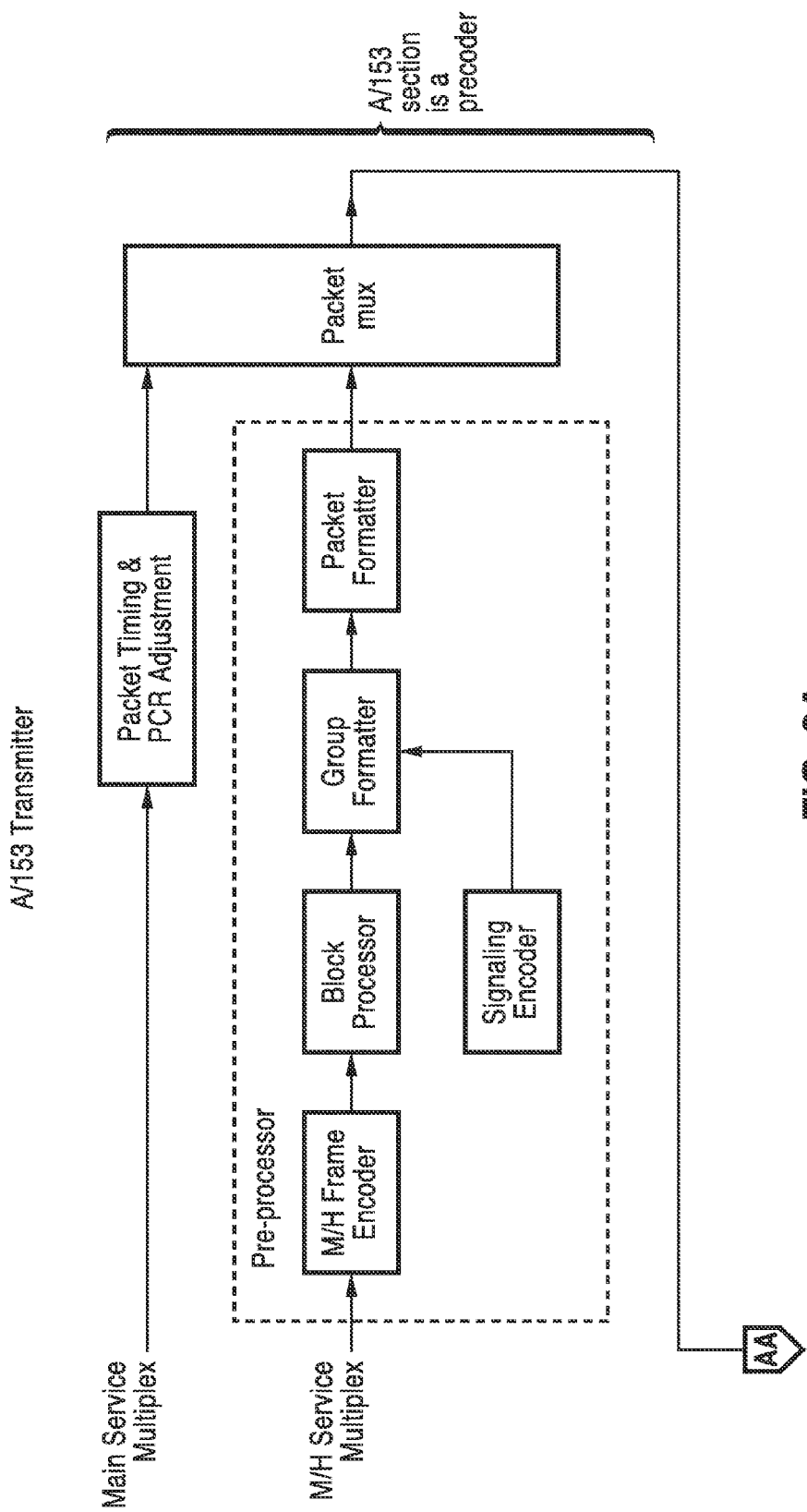
FIG. 3A and FIG. 3B is a functional block diagram for an A/153 standard transmitter known in the art.
Figure 3B:
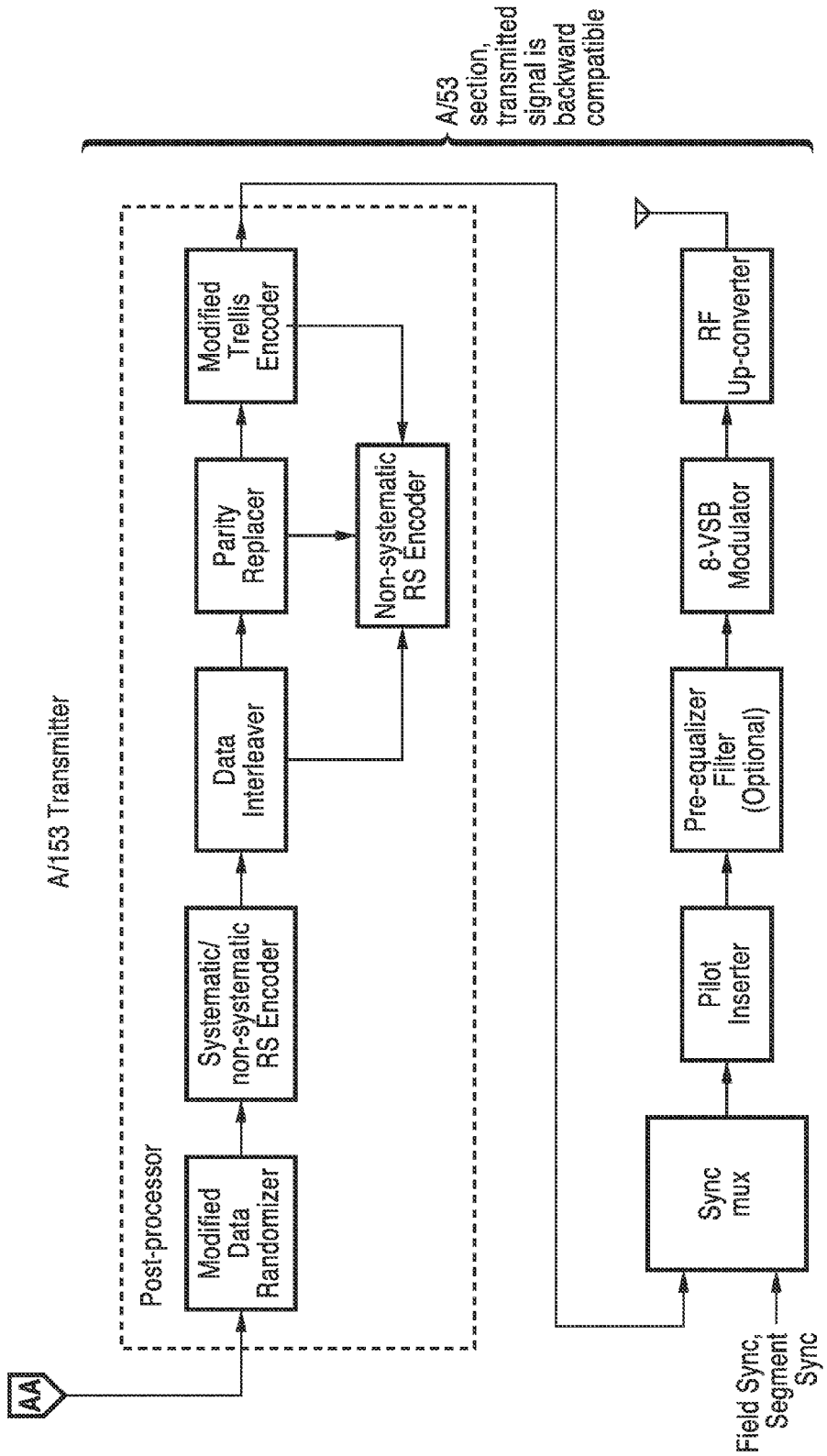
Figure 4:
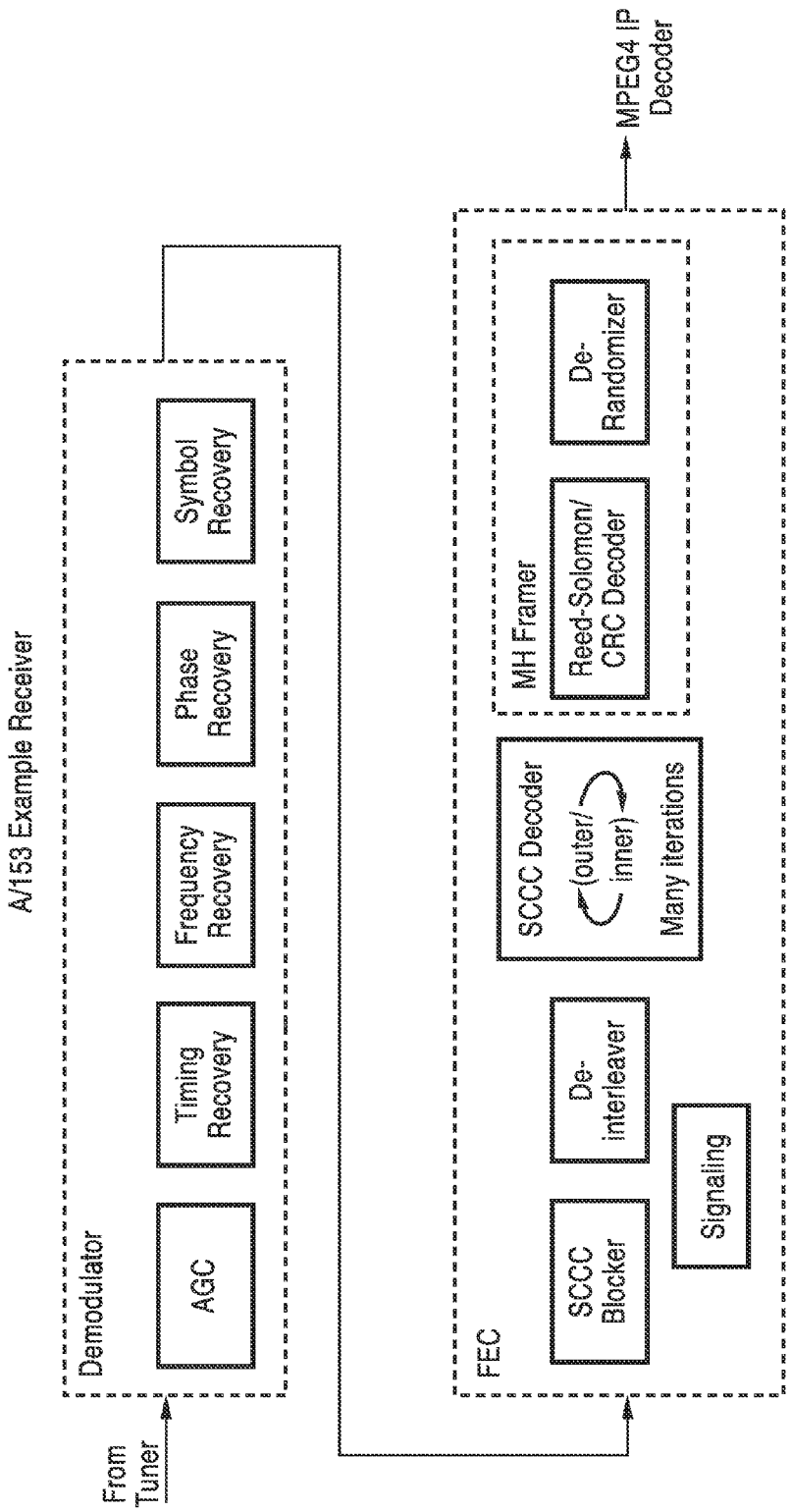
FIG. 4 is a functional block diagram for an A/153 standard receiver known in the art.
Figure 5A:
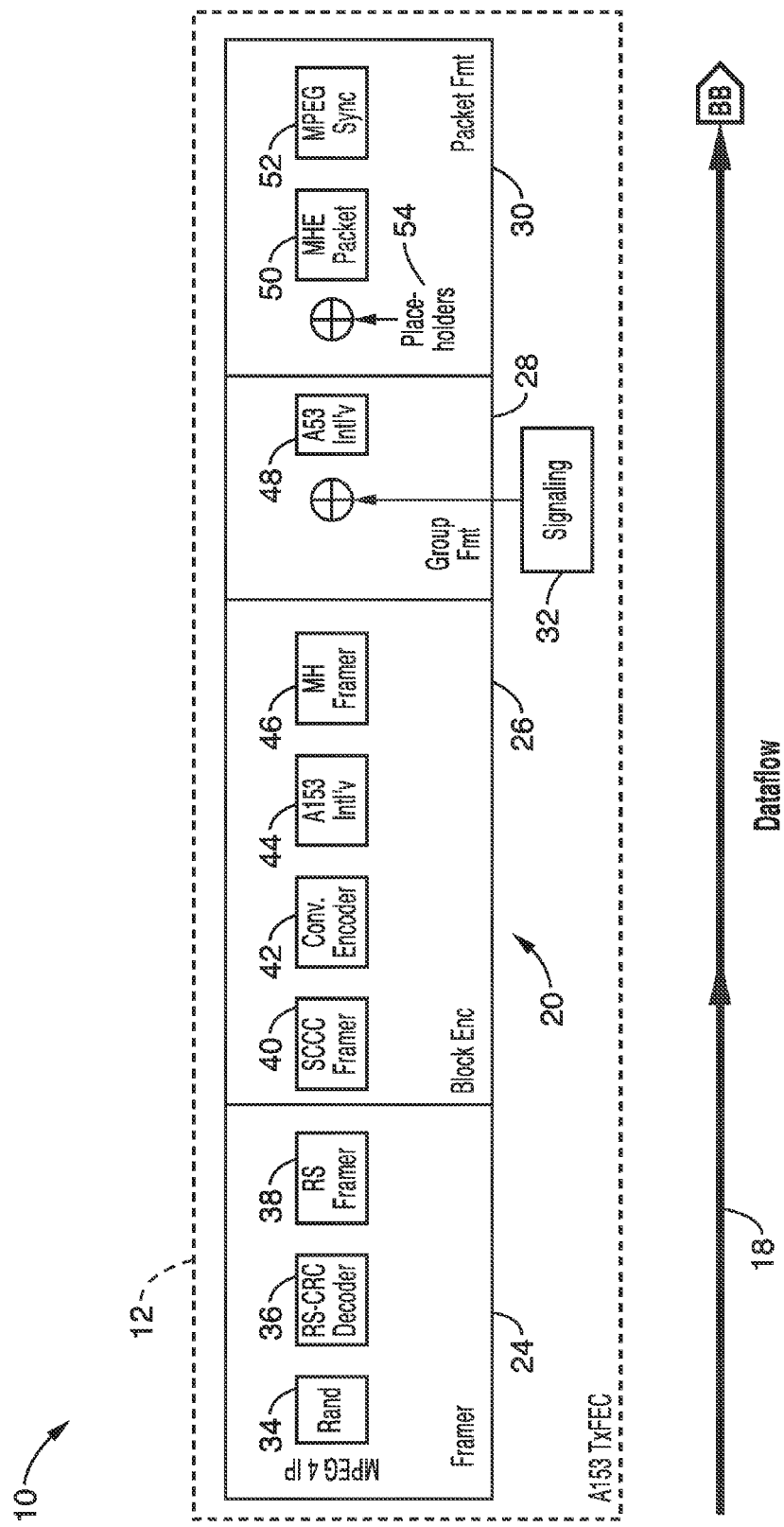
FIG. 5A-FIG. 5D is a functional block diagram of the overall system architecture of A/53 HDTV and A/153 mobile DTV combination according to one embodiment of the invention showing a transmitter->channel->receiver.

The direction of the data flow 18 through the illustrated system 10 is shown in the figures beginning from the top left of FIG. 5A to clearly show the operation steps through the system. The data flow 18 is serial in nature and the A/153 data is inserted at the transmitter as a "Pre-coder" prior to A/53 FEC operation.

Unlike the A/53 transport stream that has no fixed structure, the A/153 M/H standard provides a transport stream structure that is fixed based on M/H Frames. By convention, one M/H Frame carries main data and M/H data (encapsulated in MHE packets) that is equivalent in size to 20 VSB data frames. The M/H Frame has an offset of 37 transport stream (TS) packets from the boundary of the VSB Frame.

The M/H data that is designated to be transmitted is packaged into sets of consecutive Reed Solomon (RS) Frames. The RS Frame is the basic data delivery unit. The data from each RS Frame to be transmitted during a single M/H Frame is split up into parts called M/H Groups, and the M/H Groups are organized into M/H Parades. Typically, each M/H Frame is composed of 5 M/H Sub-Frames and each sub-frame has 16 Slots. A Slot consists of 156 TS packets (before byte interleaving) and one VSB frame is divided into 4 M/H slots. In addition, the M/H Parade is always associated with a Primary RS Frame or a Secondary RS Frame.

Figure 5B:
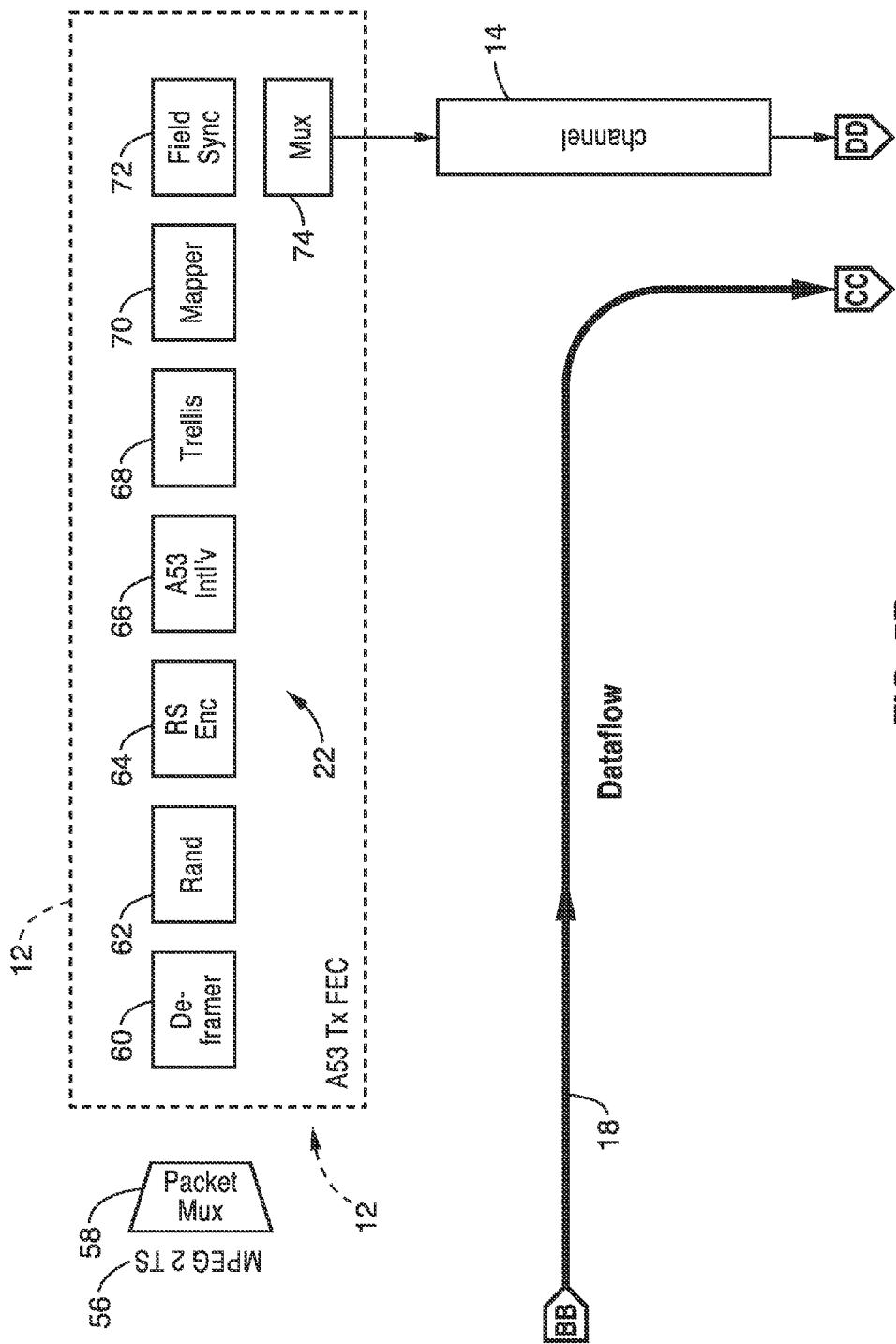

The transmitter 12 portion of the system 10 has an A/153 transmitter subsystem 20 as seen in FIG. 5A, and an A/53 transmitter subsystem 22 as seen in and FIG. 5B. The A/153 transmitter subsystem 20 operations includes M/H Frame encoding 24, Block encoding 26, Group formatting 28, Packet formatting 30, and M/H signaling encoding 32. Generally, the function of the A/153 subsystem 20 is to process and place the processed M/H service data into the proper M/H data structure. The processed enhanced data are preferably encapsulated in special MPEG-2 transport packets that are called M/H Encapsulation (MHE) packets. The encapsulated service data in any desired format, such as MPEG-2 video/audio or MPEG-4 video/audio, can be accommodated in the M/H transmission system. Processing normally includes the addition of training sequences and additional forward error correction (FEC) processes.

In the embodiment shown in FIG. 5A, the data stream processing in the M/H Frame encoding 24 operation begins with randomization at block 34, RS-CRC decoding at block 36 and RS framing at block 38. The RS Frame is partitioned into several segments of different sizes and the segments are assigned to specified regions. An SCCC specific to each region in each group with a code rate of ½ or ¼ is produced for the M/H data in each region. The Block Encoding operation 26 applies an RS Frame Portion to SCCC Block conversion at block 40, a convolutional encoder at block 42, A/153 symbol interleaving at block 44 and a M/H framer at block 46. The convolutional encoder 42 and the symbol interleaver 44 are effectively connected in a series with the trellis encoder to construct the Serially Concatenated Convolutional Code (SCCC).

The group formatting operations 28 apply an A/53 interleaver at block 48 and has signaling encoder at block 32 in the embodiment shown at FIG. 5A. Packet formatting 30 operations in FIG. 5A has a placeholder 54 and MHE packet formatting at block 50 and MPEG synchronization at block 52. The A/53 subsystem 22 of the transmitter 12 of FIG. 5B preferably receives a main or enhanced MPEG-2 transport stream 56 through a normal MPEG-2 TS multiplexing processes 58. The 8-VSB terrestrial broadcast mode in a 6 MHz channel delivers an MPEG-2 Transport Stream (MPEG-2-TS) of up to 19.39 Mbps. Incoming data passes through a de-framer 60 and is then randomized and processed for forward error correction (FEC) in the form of Reed-Solomon (RS) coding, data field interleaving and rate trellis coding. In the embodiment of FIG. 5B, all packets pass through a data randomizer 62, RS encoder 64, and A/53 interleaver 66. The data is then be processed by an E8-VSB convolutional trellis coder at functional block 68.

All output from the data from the trellis coder 68 goes through a mapper 70 that converts data to multi-level symbols and field synchronizer 72 to multiplexer 74. Output from the multiplexer 74 is transmitted.

Figure 5C:
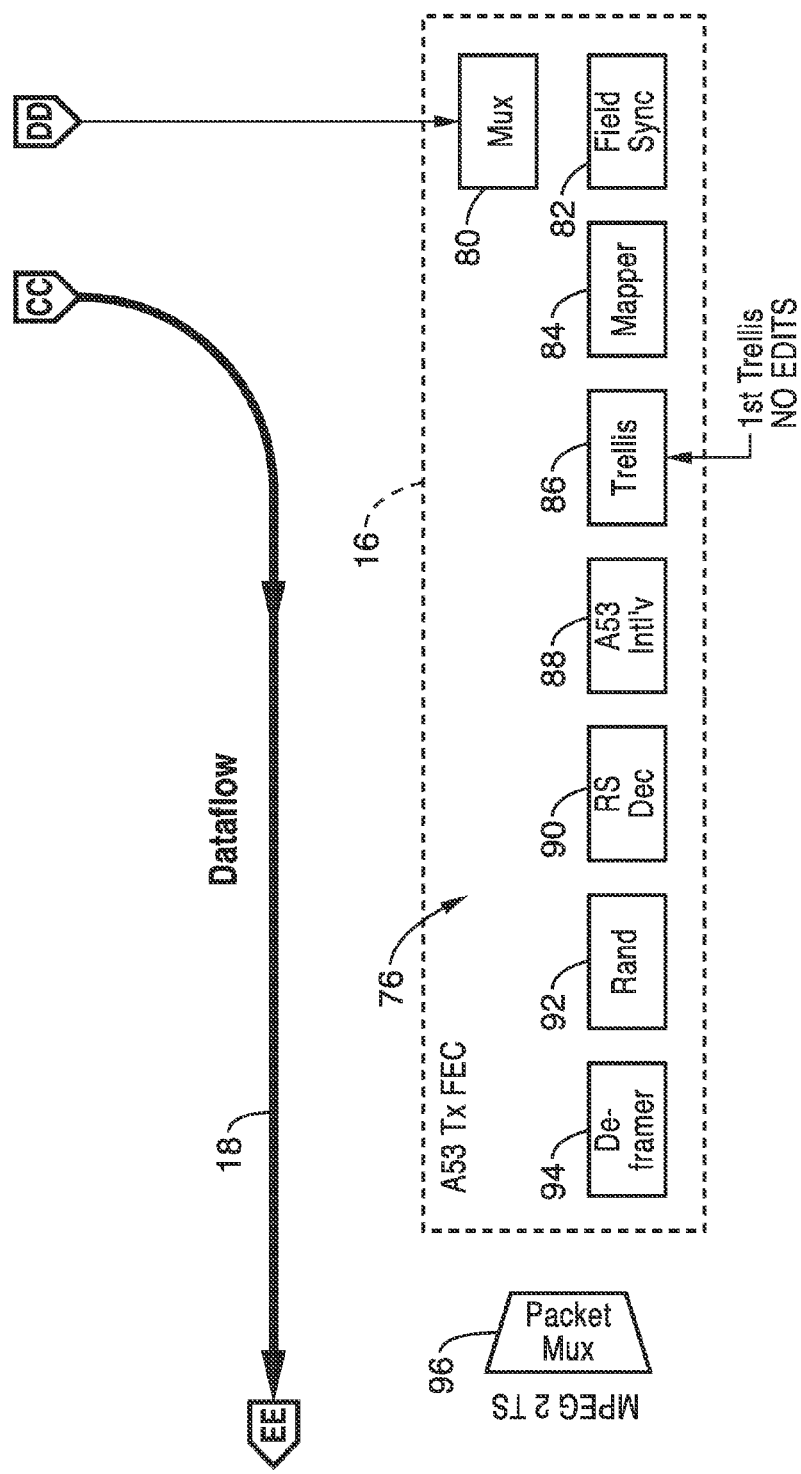
Figure 5D:
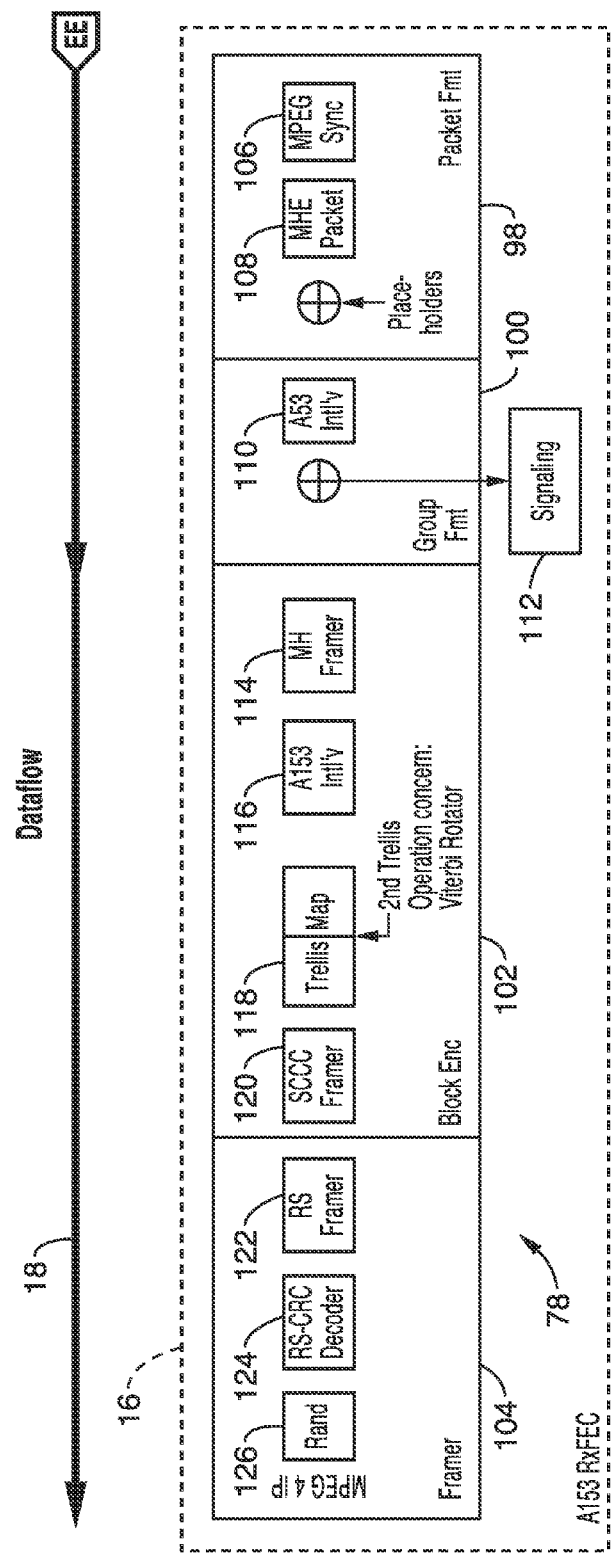

Referring now to FIG. 5C and FIG. 5D, the transmitted signals are received and processed by the receiver 16 with an A/53 receiver subsystem 76 and the A/153 subsystem 78. The receiver 16 recovers the transmitted bits representing the original video, audio, and other data from the tuned signal. The received signal is directed through multiplexer 80, field synchronizer 82 and mapper 84 to the first trellis 86. However, there are no edits made to the data at the first trellis 86. Data output from the first trellis 86 is directed through the A/53 interleave 88 to the RS decoder 90, randomizer 92 and deframer 94 to produce a MPEG-2 conformant transport stream 96.

At the receiver 16, the A/153 subsystem 78 is responsible for decoding the audio and video streams back into baseband audio and video performances. In the embodiment shown in FIG. 5D, the received tuned and demodulated signal undergoes packet formatting 98, group formatting 100, block encoding 102 and framing at block 104 to approximately return the received data to its original form. Packet formatting 98 operations include MPEG synchronization at block 106 and MHE picketing at block 108. Group formatting operations 100 have signaling functions 112 and the A/53 interleaving functions at block 110. Block encoding operations 102 utilize MH Framer 114, A/153 interleaving at block 116, a second trellis operation 118 and an SCCC framer at block 120. Finally, the framing operations 104 have RS framer functions at block 122, RS-CRC decoding at block 124 and a randomizer function at block 126 of FIG. 5D.

Within the overall system architecture of the transmitter 12, transmission channel 14 and receiver 16, it can be seen that there are two separate trellis decoders: an A/53 decoder 86 and an A/153 decoder 118. With two dedicated trellis decoders having no iterations between them, lower latency can result for throughput and control signaling. This substantially improves the channel change time for Mobile DTV and the feedback control for HDTV. With at least 2 dB of coding gain from the A/153 Trellis, robust signaling for HDTV operation can be obtained. The key here is more robust HDTV operation in dynamic channels with the use of the Mobile DTV training signals. Low latency of the A/153 mobile dataset allows for fast synchronization back to the A/53 and A/153 data symbols in the demodulator for channel correction.

Typically the HDTV and DTV receivers are separate because Mobile DTV is power conscious and the signal is divided up in time which allows power cycling to save battery life. However, according to the present invention, a simple dedicated Trellis decoder for Mobile DTV signals is used to provide data to 2nd Screen type devices in a home as well as aide HDTV demodulation while providing training data to a demodulator to help HDTV dynamic performance.

It will be appreciated that the A/153 Mobile DTV is designed to use Serially Concatenated Convolutional Codes (SCCC), in which case a soft input/soft output (SISO) Viterbi Algorithm is used to process Log Likelihood Ratio's (LLR's) iteratively until small performance gains are realized. The performance of these SCCC's is quite good and beats the performance of two Trellis decoders. However, a SCCC decoder cannot output both legacy A/53 HDTV data and Mobile DTV A/153MPEG 4 Internet Protocol (IP) data. To have both sets of data, the legacy A/53 HDTV decoder needs to be kept intact, while adding on an A/153 Mobile DTV decoder.

The addition of a second Viterbi Decoder (Trellis Decoder) creates a unique issue in that LLR values need to be derived from hard-decision values. This reduces the effective coding gain of a Viterbi algorithm as input symbols are no longer in-between integer decided numbers but rather the hard decoded integers from a previous Trellis Decoder. The typical Euclidean distance equation of $E(x) 2-E(x)*x$ showed no real coding gain above the A/53 output, nor did Hamming distance calculations. Focusing on these LLR values will affect the Viterbi performance.

However, assigning specific numbers to LLR values according to the present invention creates controlled code distances for the A/153 Viterbi decoder to work with. Certain paths can become more prevalent and easier to identify in the Viterbi routine and therefore create better performance. The present invention uses a derived table of LLR values assigned to each state for each input symbol allowing a Viterbi decoder to again perform as if the input was soft decoded symbols. It is these LLR assignments that give the performance gain of the system.

The data for A/153 is divided into blocks, which the second Viterbi Decoder needs to account for in the present invention. The easiest way to do this is to apply separate Viterbi Decoders to each block and rotate input/outputs among them. This means ten separate Viterbi Decoders are applied to A/153 data (five for the paired data). A novel feature of the present invention is that each of the Viterbi Decoders is fed with proper block data while a continuous output stream of decoded data is drawn from to fill an output buffer. This allows resetting of Viterbi Decoders without losing data stuck in memory from the last decoding cycle. (There is always a delay in Viterbi Decoding as it finds the most probable path of symbols).

This inventive architecture allows for easy operation and fast architecture setup for Parades of A/153 data as each parade can call out Separate/Paired SCCC blocking and other FEC parameters such as different coding state machines per block (Region NB has one coding style while Region C/D has another in A/153 Part 2). There are five Paired SCCC Blocks or ten Separate SCCC blocks which can be utilized on a per Parade basis.

Control of each Viterbi Decoder is very similar, and therefore, one control signal set can be applied to all Viterbi Decoders. This control is Initialization flags, Termination Flags, Branch Metric value settings, etc. Each flag controls the Viterbi decoders on a real-time basis and can be configured/changed in real-time.

Figure 6:
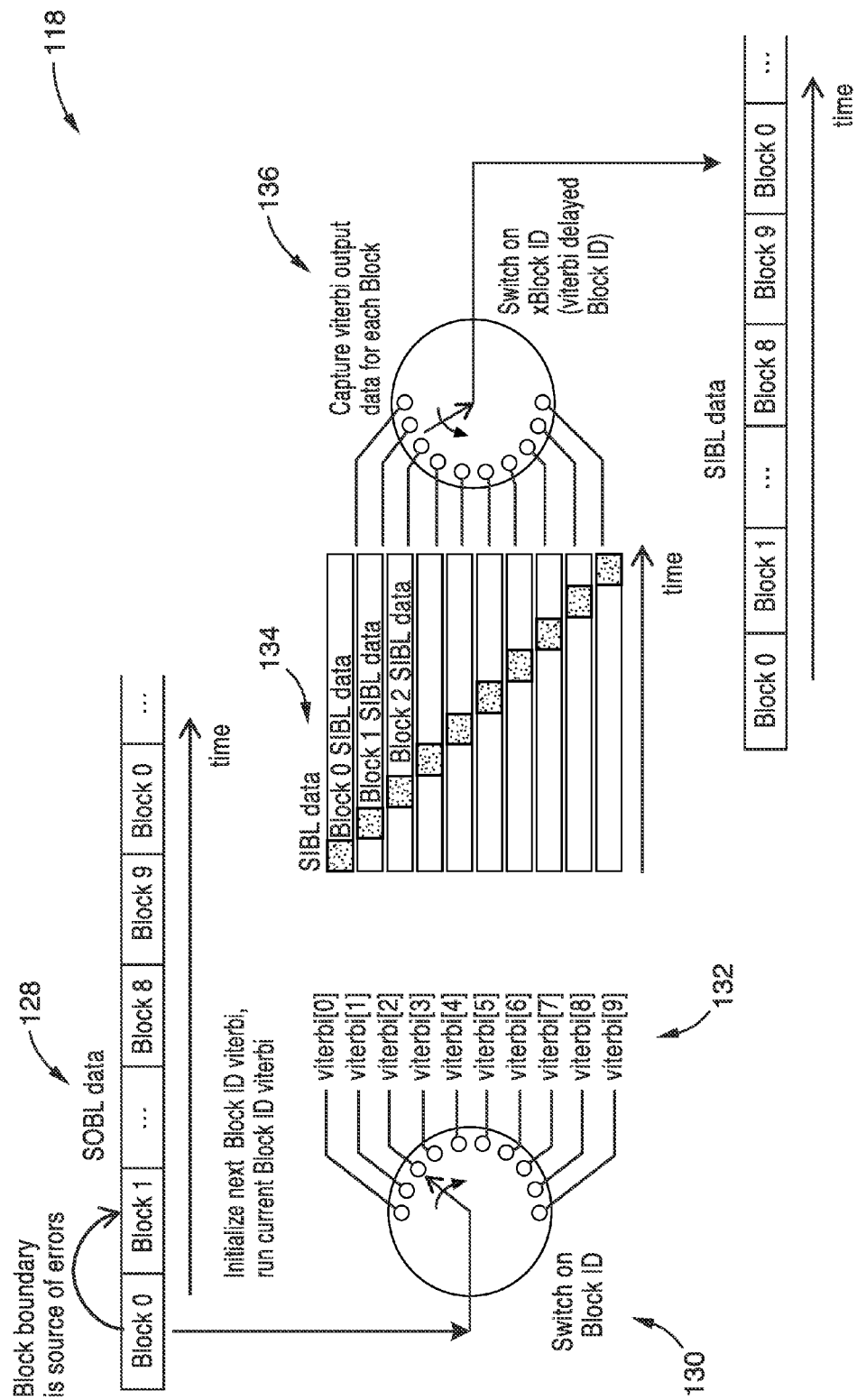
FIG. 6 is a schematic functional diagram of a Viterbi Rotator used to segregate SCCC Blocks of data.

Turning now to FIG. 6, the preferred Viterbi rotator for use with the second trellis 118 is schematically illustrated. The Viterbi Rotator 118 is used to segregate SCCC Blocks of data. Typically in a SCCC Turbo decoder, the Blocks are separately iterated over and over to gain performance. However, in a Viterbi Decoder (with Hard Input Hard Output (HIHO)), the Viterbi memory needs to stay intact per block while outputting the data linearly. This rotator 118 allows for that since the input rotator 130 shifts new data into the designated Viterbi in a linear fashion, but the output rotator 136 is delayed by the Viterbi Window lengths to pick up the correct values.

Figure 7:
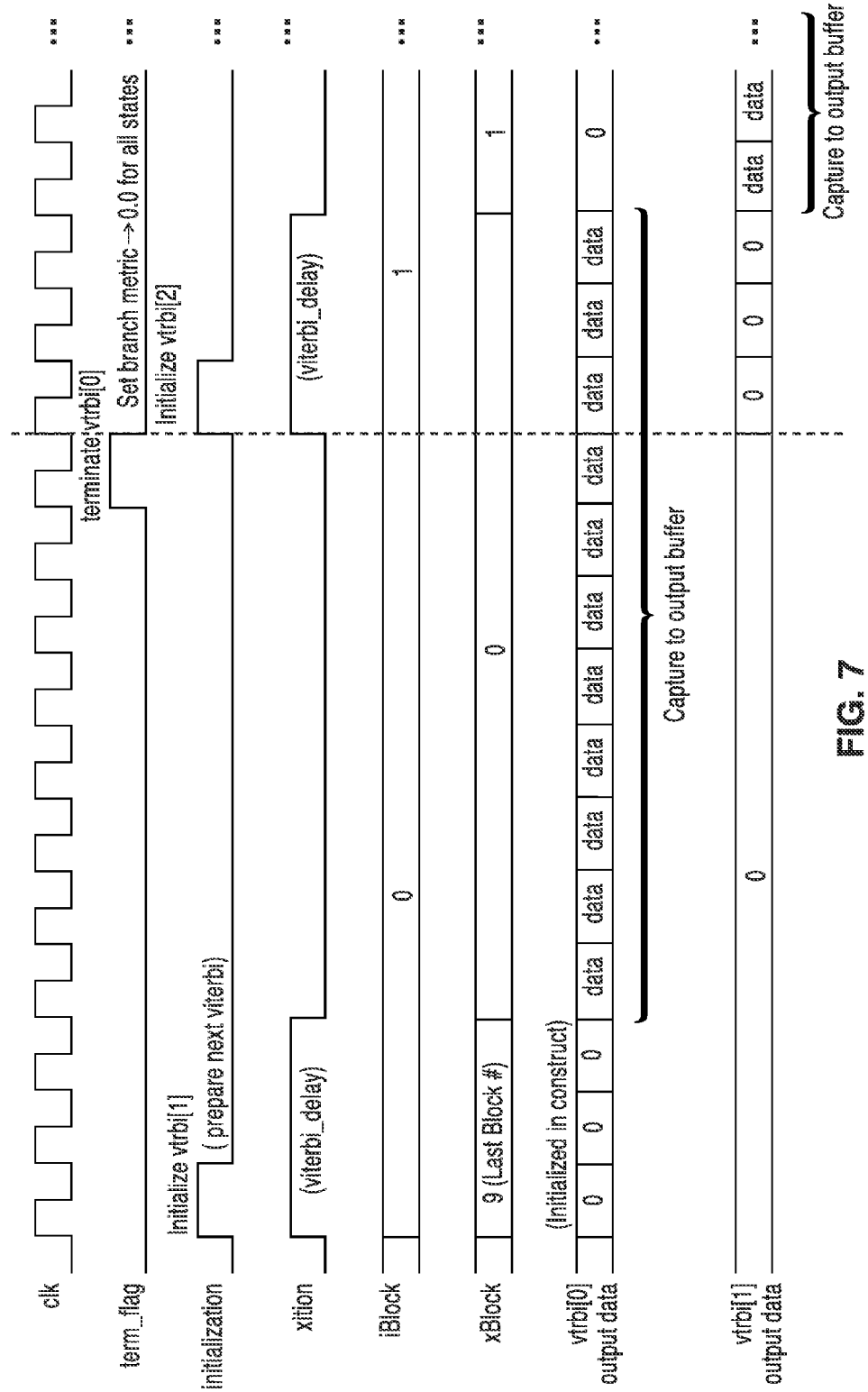
FIG. 7 is a timing diagram of the input data (from an input rotator) to the output data (from an output rotator).

In the embodiment of the invention shown in FIG. 6 and FIG. 7, the rotator 118 design starts out with input data 128 titled SOBL (SCCC output block length) bytes coming into a rotator 130 which parses out the data to separate Viterbi Decoders 132. FIG. 7 shows the timing of the input data (from input rotator 130) to the output data (from the output rotator 136). At the end of the current block data (last symbol), a Termination Flag is sent to the current Viterbi Decoder to signal the end of processing. Upon a transition to the next Viterbi Decoder 132 (reset in the Convolution Encoder), the symbol distance metric for the last Viterbi Decoder is zeroed out while data is fed to the next Viterbi Decoder. For the length of the Viterbi delay (parameterizable with sliding window lengths, memory size, etc.) both the last block Viterbi Decoder and current block Viterbi Decoder are clocked. The output buffer is filled with output from the last block Viterbi Decoder during this transition phase (Viterbi delay) and when the delay is over, the output buffer if filled with the current block Viterbi Decoder output. This allows for seamless output of data titled SIBL (SCCC input block length) bytes 134.

Figure 8:
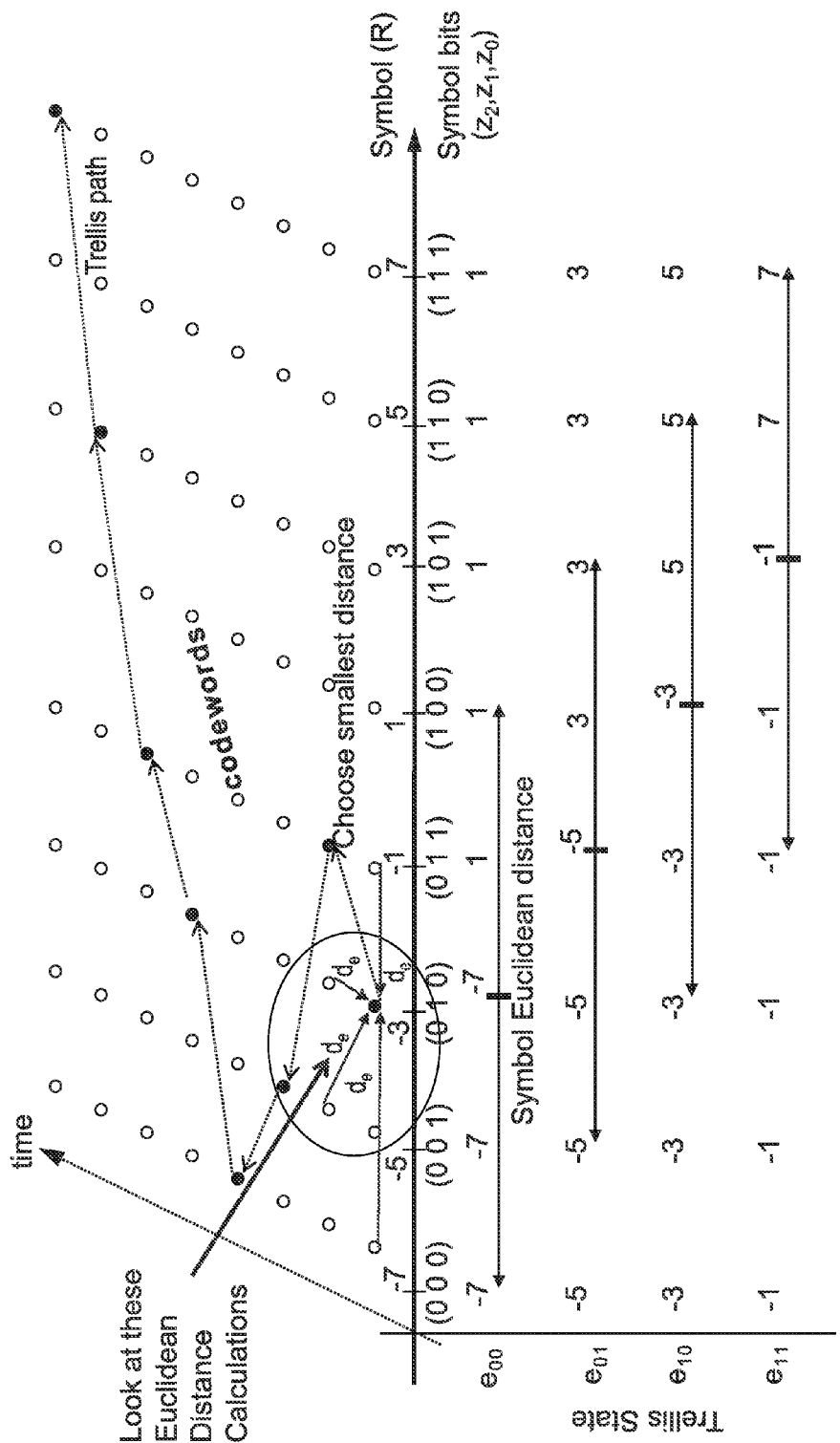
FIG. 8 is a 3-D drawing to show the correlation between time (codeword selection), Trellis states and input symbols.

FIG. 8 shows the correlation between time (codeword selection), Trellis states, and input symbols. The example shown in FIG. 8 is for the A/53 HDTV data, but applies to the A/153 data as well (any other Trellis decoder). Attention is given to the Euclidean distance measurements for codewords and how it relates to the input symbols/Trellis states. Generally this calculation is a Log Likelihood Ratio (LLR), but, the present invention uses a selected set of numbers instead (described below). The top portion (which is time) shows an example Viterbi decoding path typically seen in textbooks.

FIG. 9 shows example numbers used in the present invention instead of LLR/Euclidean/Hamming distance calculations for a rate ½ Viterbi Decoder.

Figure 10:
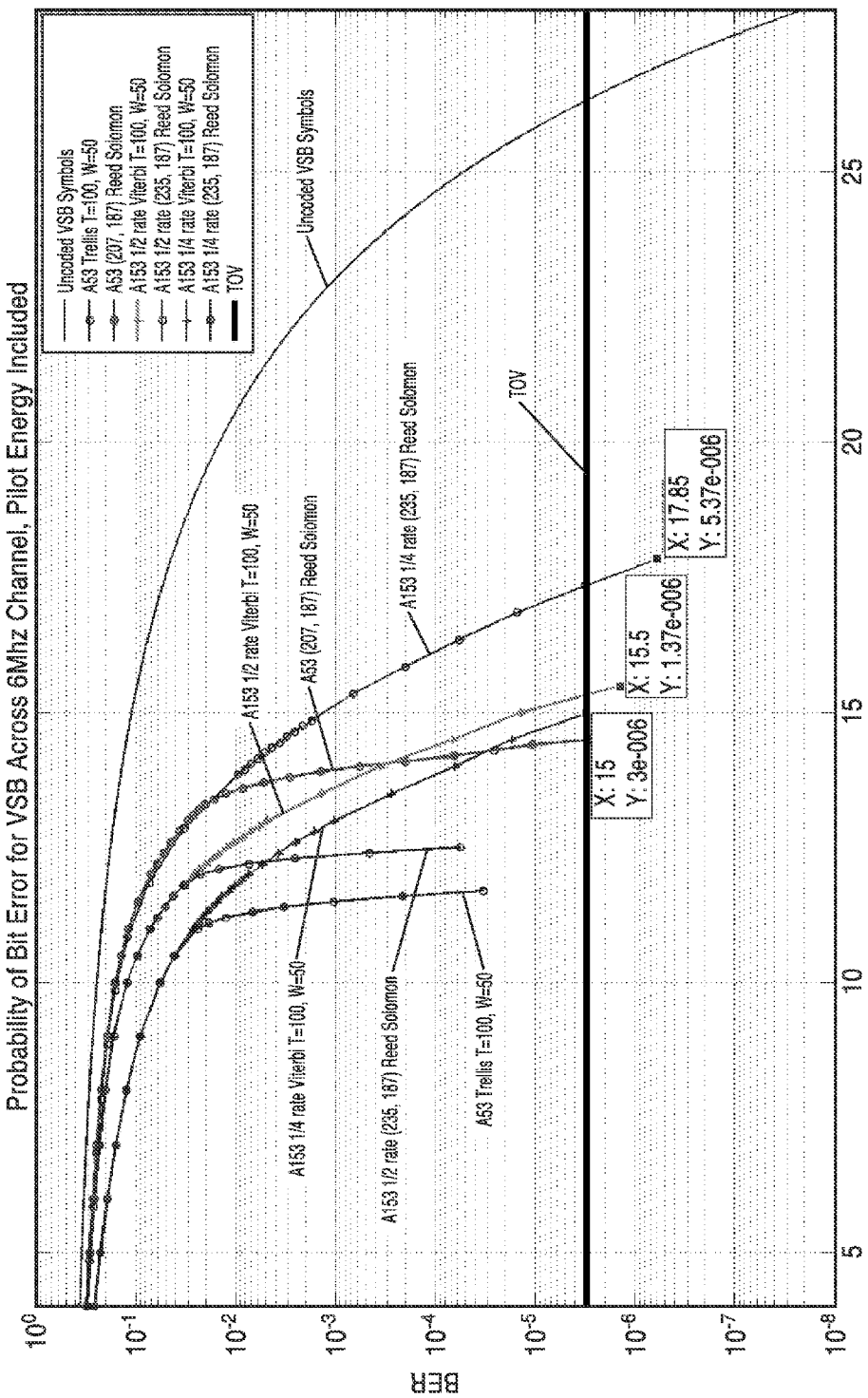
FIG. 10 is a graph of the performance with a HIHO type of Viterbi Decoder.

FIG. 10 shows the performance achieved with a HIHO type of Viterbi Decoder according to an embodiment of the invention. Up to 3 dB gain over the A/53 HDTV signal can be seen to support it with extra training data. Beneficially, in the present invention latency is very low since there are no iterations. Therefore higher Doppler and tough channel conditions can be supported for HDTV while also supplying an economical performance for A/153 Mobile DTV.

As parades can change parameters in real time from broadcasters, an easy configurable receiver is beneficial. This architecture also allows very low latency of symbols which can enable faster channel change times and faster feedback of signals to a front end demodulator (aiding Doppler performance).

Referring now to FIG. 11 through FIG. 16B, LLR assignments are preferably derived with the following 4-step routine.

Step 1: Start with the Hamming Distance. FIG. 11 shows an example that uses the A/153 Part 2:2009 ¼ rate SCCC code. The Input of 0000 to state 0001 has a Hamming Distance=1.

Input of 1111 to state 0001 has a Hamming distance of 3, i.e. Hamming Distance=#bits in difference. So for the ¼ rate code, a listing of values with certain Hamming Distances can be made.

Highlighted values are valid states in A/153 ¼ rate SCCC coding. Other table entries are just possible values with a 4-bit input. So for each valid state, the Hamming Distance is either 0, 1, 2, 3 or 4. Putting this in table form, if the input value is 3, the Hamming distance for each valid state is shown in FIG. 12A. If the input value is 1, the Hamming distance for each valid state is shown in FIG. 12B.

Step 2: Space out the Hamming Distances to allow for some adjustment by multiplying each Hamming Distance by 4. These values will now be labeled the assignment values. Now, each valid state has a Hamming Distance of 0, 4, 8, 12 or 16. If the input value is 3, the Hamming distance for each valid state is shown in FIG. 13A. If the input value is 1, the Hamming distance for each valid state is shown in FIG. 13B.

Step 3: Increase/Decrease value by +/−1 based on adjacent bit similarity. FIG. 14A shows three adjacent bits that are similar and the same between input and potential state, therefore LOWER the Assigned Value by 2. FIG. 14B shows two adjacent bits that are similar and the same between input and potential state, therefore LOWER the Assigned Value by 1. FIG. 14C shows that no adjacent bits are similar, therefore keep Hamming Distance. FIG. 14D shows two adjacent bits that are similar, but differ between input and potential state, therefore INCREASE The Assigned Value by 1! FIG. 14E shows adjacent bits that are similar, but differ between input and potential state, therefore INCREASE The Assigned Value by 2!

The assigned values then become those shown in FIG. 15A and FIG. 15B. If the input value is 3, the Assigned Value for each valid state is shown in FIG. 15A. Values at state 0 and 15 have +1, −1 attributes which cancel each other out. If the input value is 1, the Assigned Value for each valid state is shown in FIG. 15B.

Step 4: Iterate LLR values +/−1 based on BER performance. Run BER simulations and tweak the Assigned Values until BER performance becomes the best. This requires a simulator with Tx and Rx decoding functions and a BER calculator. It can take some time to find the best Assigned Values, but it can be done. The results for the A/153 SCCC ¼ rate code examples are shown in FIG. 16. If the input value is 3, the Hamming distance for each valid state is shown in FIG. 16A. If the input value is 1, the Hamming distance for each valid state is shown in FIG. 16B. These iterated assigned values will be used in the Demapper function which applies distance values to each state for each input value to the Viterbi Decoder.

Having a look-up table (ROM) for each state of trellis for LLR mapping of each symbol is the easiest form of implementation. It could also be dynamic in that values are assigned based on channel identifications/SNR readings. Having control over the assigned LLR values should have benefits of channel tuning time, performance and general robustness of a receiver.

Although the embodiment shown in FIG. 5A through FIG. 16 was used to illustrate the invention, it will be understood that other system configurations are suitable. For example, it is preferred that two Trellis (Viterbi) decoders will operate serially so as to not disturb the A/53 HDTV data. However, the decoders could be configured in parallel depending on how much memory/area is desired on a demodulator chip. The design is intended for a silicon semiconductor chip which includes all memory/control signals inside.

Similarly, for any convolutional code which is reset periodically, the concept of Viterbi rotators can apply. A HIHO Viterbi Decoder use-case was described, but other decoders (not just Viterbi) can be used as well. If coding also deliberately switches coders (or code rates) then this design can apply. It is most beneficial to convolutional coding where symbol memory is required with resetting boundaries.

Likewise, the current preferred application is for a combination demodulator of HDTV and Mobile DTV signals where fast feedback of Mobile DTV training signals can be applied to an equalizer from a Viterbi Decoder instead of from an iterative SCCC decoder. This aids Doppler performance of the combination chip. But any application which has a combination of separate coding in a symbol set can apply.

In-home 2nd screen devices could also be fed with the Mobile DTV data content with this A/53, A/153 combination chip. Furthermore, using a second Trellis (Viterbi) decoder with different rule sets can be used to verify or embolden a received signal.

From the discussion above it will be appreciated that the invention can be embodied in various ways, including the following:

1. An apparatus for processing a combined A/53 and A/153 standard broadcast signal, comprising: (a) a receiver with a decoder and an output, the receiver configured to receive a combined A/53 and A/153 RF signal and provide an output transport signal stream; and (b) programming executable on a processor of the decoder processing the received combined signal, the processing comprising: (i) sub-processing an A/53 signal component with a first Trellis decoder without editing; (ii) sub-processing an A/153 signal component, the sub-processing comprising: packet formatting the A/153 signal component; group formatting the formatted packets; block encoding the group formatted packets with a second Trellis decoder; and framing the encoded group formatted packets; and (iii) presenting a transport stream of processed signals for audio/visual decoding through the output.

2. An apparatus as recited in any of the preceding embodiments, wherein the first Trellis decoder is a Viterbi decoder and the second Trellis decoder is a second Viterbi decoder.

3. An apparatus as recited in any of the preceding embodiments, wherein the second Trellis decoder has a Hard Input Hard Output (HIHO) type of architecture.

4. An apparatus as recited in any of the preceding embodiments, wherein said second Viterbi decoder comprises a block Viterbi rotator, said rotator dedicating a Viterbi decoder for each data block and sequentially initializing each dedicated Viterbi decoder.

5. An apparatus as recited in any of the preceding embodiments, wherein each Viterbi decoder dedicated by said block rotator shifts out the last values from the last block while resetting itself for the next block.

6. An apparatus as recited in any of the preceding embodiments, wherein said sub-processing with a second Viterbi decoder further comprises assigning Log Likelihood Ratio (LLR) numbers from a table of LLR numbers.

7. An apparatus as recited in any of the preceding embodiments, wherein said assignment of Log Likelihood Ratio (LLR) numbers comprises: acquiring hamming distances; spacing the hamming distances to produce assignment values; increasing or decreasing an assignment value by +/−1 based on adjacent bit similarity; and iteratively adjusting assigned values until an optimal bit error rate is obtained to produce final LLR numbers.

8. An apparatus as recited in any of the preceding embodiments, wherein said packet formatting of said A/153 signal component sub-processing comprises MPEG synchronization and MHE packet formatting.

9. An apparatus as recited in any of the preceding embodiments, wherein said group formatting of said A/153 signal component sub-processing comprises A/53 interleaving.

10. An apparatus as recited in any of the preceding embodiments, wherein said block encoding of said A/153 signal component sub-processing comprises: MH framing; A/153 symbol interleaving; encoding with the second Trellis decoder; and serial concatenated convolutional code (SCCC) framing.

11. An apparatus as recited in any of the preceding embodiments, wherein said framing of said A/153 signal component sub-processing comprises: Reed-Solomon (ES) framing; Reed-Solomon Cyclic Redundancy Check (RS-CRC) decoding; and randomizing the decoded signal.

12. An apparatus as recited in any of the preceding embodiments, wherein said sub-processing of the A/53 signal component further comprises the steps of: multiplexing the received A/53 signal; field synchronizing the multiplexed signal; mapping the synchronized signal; decoding the mapped signal with a first Trellis decoder without edits; interleaving trellis decoded data; decoding data with an Reed-Solomon (RS) decoder; randomizing RS decoded data; and deframing.

13. An apparatus for processing a combined A/53 and A/153 standard broadcast signal, comprising: (a) a receiver with a decoder and an output, the receiver configured to receive a combined A/53 and A/153 RF signal and provide an output transport signal stream; and (b) programming executable on a processor of the decoder processing the received combined signal, the processing comprising: (i) sub-processing an A/53 signal component with a first Viterbi decoder without editing; (ii) sub-processing of an A/153 signal component, the sub-processing comprising: MPEG synchronization and MHE packet formatting of the A/153 signal component; group formatting the formatted packets; block encoding the group formatted packets with a second Viterbi decoder using assigned Log Likelihood Ratio (LLR) numbers from a table of LLR numbers; and framing the encoded group formatted packets; and (iii) presenting a transport stream of processed signals for audio/visual decoding through the output.

14. An apparatus as recited in any of the preceding embodiments, wherein said assignment of Log Likelihood Ratio (LLR) numbers comprises: acquiring hamming distances; spacing the hamming distances to produce assignment values; increasing or decreasing an assignment value by +/−1 based on adjacent bit similarity; and iteratively adjusting assigned values until an optimal bit error rate is obtained to produce final LLR numbers.

15. An apparatus as recited in any of the preceding embodiments, wherein said second Viterbi decoder comprises a block Viterbi rotator, said rotator dedicating a Viterbi decoder for each data block and sequentially initializing each dedicated Viterbi decoder.

16. An apparatus as recited in any of the preceding embodiments, wherein each Viterbi decoder dedicated by said block rotator shifts out the last values from the last block while resetting itself for the next block.

17. A method for processing a combined A/53 and A/153 standard broadcast signal, comprising: receiving an RF signal with combined A/53 and A/153 signals; sub-processing an A/53 signal component with a Trellis decoder without edits; sub-processing an A/153 signal component with a second Trellis decoder; and presenting a transport stream of processed signals for audio/visual decoding.

18. A method as recited in any of the preceding embodiments, wherein said sub-processing of the A/153 signal component further comprises: packet formatting the A/153 signal component; group formatting the formatted packets; block encoding the group formatted packets with the second Trellis decoder; and framing the encoded packets.

19. A method as recited in any of the preceding embodiments, wherein the first Trellis decoder is a Viterbi decoder and the second Trellis decoder is a block Viterbi rotator, said rotator dedicating a Viterbi decoder for each data block and sequentially initializing each dedicated Viterbi decoder and shifting out the last values from the last block while resetting itself for the next block.

20. A method as recited in any of the preceding embodiments, wherein said sub-processing with a second Viterbi decoder further comprises assigning Log Likelihood Ratio (LLR) numbers from a table of LLR numbers, the table generated by: acquiring hamming distances; spacing the hamming distances to produce assignment values; increasing or decreasing an assignment value by +/−1 based on adjacent bit similarity; and iteratively adjusting assigned values until an optimal bit error rate is obtained to produce final LLR numbers.

Embodiments of the present invention may be described with reference to flowchart illustrations of methods and systems according to embodiments of the invention, and/or algorithms, formulae, or other computational depictions, which may also be implemented as computer program products. In this regard, each block or step of a flowchart, and combinations of blocks (and/or steps) in a flowchart, algorithm, formula, or computational depiction can be implemented by various means, such as hardware, firmware, and/or software including one or more computer program instructions embodied in computer-readable program code logic. As will be appreciated, any such computer program instructions may be loaded onto a computer, including without limitation a general purpose computer or special purpose computer, or other programmable processing apparatus to produce a machine, such that the computer program instructions which execute on the computer or other programmable processing apparatus create means for implementing the functions specified in the block(s) of the flowchart(s).

Accordingly, blocks of the flowcharts, algorithms, formulae, or computational depictions support combinations of means for performing the specified functions, combinations of steps for performing the specified functions, and computer program instructions, such as embodied in computer-readable program code logic means, for performing the specified functions. It will also be understood that each block of the flowchart illustrations, algorithms, formulae, or computational depictions and combinations thereof described herein, can be implemented by special purpose hardware-based computer systems which perform the specified functions or steps, or combinations of special purpose hardware and computer-readable program code logic means.

Furthermore, these computer program instructions, such as embodied in computer-readable program code logic, may also be stored in a computer-readable memory that can direct a computer or other programmable processing apparatus to function in a particular manner, such that the instructions stored in the computer-readable memory produce an article of manufacture including instruction means which implement the function specified in the block(s) of the flowchart(s). The computer program instructions may also be loaded onto a computer or other programmable processing apparatus to cause a series of operational steps to be performed on the computer or other programmable processing apparatus to produce a computer-implemented process such that the instructions which execute on the computer or other programmable processing apparatus provide steps for implementing the functions specified in the block(s) of the flowchart(s), algorithm(s), formula (e), or computational depiction(s).

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. An apparatus for processing a combined A/53 and A/153 standard broadcast signal, comprising:
   (a) a receiver with a decoder and an output, the receiver configured to receive a combined A/53 and A/153 RF signal and provide an output transport signal stream; and
   (b) programming executable on a processor of the decoder processing the received combined signal, the processing comprising:
      (i) sub-processing an A/53 signal component with a first Trellis decoder without editing;
      (ii) sub-processing an A/153 signal component, the sub-processing comprising:
         packet formatting the A/153 signal component;
         group formatting the formatted packets;
         block encoding the group formatted packets with a second Trellis decoder; and
         framing the encoded group formatted packets; and
      (iii) presenting a transport stream of processed signals for audio/visual decoding through the output.

2. An apparatus as recited in claim 1, wherein the first Trellis decoder is a Viterbi decoder and the second Trellis decoder is a second Viterbi decoder.

3. An apparatus as recited in claim 1, wherein the second Trellis decoder has a Hard Input Hard Output (HIHO) type of architecture.

4. An apparatus as recited in claim 1, wherein said group formatting of said A/153 signal component sub-processing comprises A/53 interleaving.

5. An apparatus as recited in claim 1, wherein said block encoding of said A/153 signal component sub-processing comprises:
   MH framing;
   A/153 symbol interleaving;
   encoding with the second Trellis decoder; and
   serial concatenated convolutional code (SCCC) framing.

6. An apparatus as recited in claim 1, wherein said sub-processing of the A/53 signal component further comprises the steps of:
   multiplexing the received A/53 signal;
   field synchronizing the multiplexed signal;
   mapping the synchronized signal;
   decoding the mapped signal with a first Trellis decoder without edits;
   interleaving trellis decoded data;
   decoding data with an Reed-Solomon (RS) decoder;
   randomizing RS decoded data; and
   deframing.

7. An apparatus for processing a combined A/53 and A/153 standard broadcast signal, comprising:
   (a) a receiver with a decoder and an output, the receiver configured to receive a combined A/53 and A/153 RF signal and provide an output transport signal stream; and
   (b) programming executable on a processor of the decoder processing the received combined signal, the processing comprising:
      (i) sub-processing an A/53 signal component with a first Viterbi decoder without editing;
      (ii) sub-processing of an A/153 signal component, the sub-processing comprising:
         MPEG synchronization and MHE packet formatting of the A/153 signal component;
         group formatting the formatted packets;
         block encoding the group formatted packets with a second Viterbi decoder using assigned Log Likelihood Ratio (LLR) numbers from a table of LLR numbers; and
         framing the encoded group formatted packets; and
      (iii) presenting a transport stream of processed signals for audio/visual decoding through the output.

8. An apparatus as recited in claim 2, wherein said second Viterbi decoder comprises a block Viterbi rotator, said rotator dedicating a Viterbi decoder for each data block and sequentially initializing each dedicated Viterbi decoder.

9. An apparatus as recited in claim 8, wherein each Viterbi decoder dedicated by said block rotator shifts out the last values from the last block while resetting itself for the next block.

10. An apparatus as recited in claim 2, wherein said sub-processing with a second Viterbi decoder further comprises assigning Log Likelihood Ratio (LLR) numbers from a table of LLR numbers.

11. An apparatus as recited in claim 10, wherein said assignment of Log Likelihood Ratio (LLR) numbers comprises:
   acquiring hamming distances;
   spacing the hamming distances to produce assignment values;
   increasing or decreasing an assignment value by +/−1 based on adjacent bit similarity; and
   iteratively adjusting assigned values until an optimal bit error rate is obtained to produce final LLR numbers.

12. An apparatus as recited in claim 1, wherein said packet formatting of said A/153 signal component sub-processing comprises MPEG synchronization and MHE packet formatting.

13. An apparatus as recited in claim 7, wherein said assignment of Log Likelihood Ratio (LLR) numbers comprises:
   acquiring hamming distances;
   spacing the hamming distances to produce assignment values;
   increasing or decreasing an assignment value by +/−1 based on adjacent bit similarity; and iteratively adjusting assigned values until an optimal bit error rate is obtained to produce final LLR numbers.

14. An apparatus as recited in claim 7, wherein said second Viterbi decoder comprises a block Viterbi rotator, said rotator dedicating a Viterbi decoder for each data block and sequentially initializing each dedicated Viterbi decoder.

15. An apparatus as recited in claim 8, wherein each Viterbi decoder dedicated by said block rotator shifts out the last values from the last block while resetting itself for the next block.

16. An apparatus as recited in claim 1, wherein said framing of said A/153 signal component sub-processing comprises:
   Reed-Solomon (ES) framing;
   Reed-Solomon Cyclic Redundancy Check (RS-CRC) decoding; and
   randomizing the decoded signal.

17. A method for processing a combined A/53 and A/153 standard broadcast signal, comprising:
   receiving an RF signal with combined A/53 and A/153 signals;
   sub-processing an A/53 signal component with a Trellis decoder without edits;
   sub-processing an A/153 signal component with a second Trellis decoder; and
   presenting a transport stream of processed signals for audio/visual decoding.

18. A method as recited in claim 17, wherein said sub-processing of the A/153 signal component further comprises:
   packet formatting the A/153 signal component;
   group formatting the formatted packets;
   block encoding the group formatted packets with the second Trellis decoder; and
   framing the encoded packets.

19. A method as recited in claim 17, wherein the first Trellis decoder is a Viterbi decoder and the second Trellis decoder is a block Viterbi rotator, said rotator dedicating a Viterbi decoder for each data block and sequentially initializing each dedicated Viterbi decoder and shifting out the last values from the last block while resetting itself for the next block.

20. A method as recited in claim 19, wherein said sub-processing with a second Viterbi decoder further comprises assigning Log Likelihood Ratio (LLR) numbers from a table of LLR numbers, the table generated by:
   acquiring hamming distances;
   spacing the hamming distances to produce assignment values;
   increasing or decreasing an assignment value by +/−1 based on adjacent bit similarity; and
   iteratively adjusting assigned values until an optimal bit error rate is obtained to produce final LLR numbers.

* * * * *